(12) United States Patent
Kim et al.

(10) Patent No.: US 7,860,143 B2
(45) Date of Patent: Dec. 28, 2010

(54) METAL-ASSISTED DBRS FOR THERMAL MANAGEMENT IN VCSELS

(75) Inventors: Jin K. Kim, St. Louis Park, MN (US); Tzu-Yu Wang, Maple Grove, MN (US); Gyoungwon Park, Allentown, PA (US)

(73) Assignee: Finisar Corporation, Sunnyvale, CA (US)

( * ) Notice: Subject to any disclaimer, the term of this patent is extended or adjusted under 35 U.S.C. 154(b) by 148 days.

(21) Appl. No.: 11/026,161

(22) Filed: Dec. 30, 2004

(65) Prior Publication Data

US 2005/0243890 A1 Nov. 3, 2005

Related U.S. Application Data

(60) Provisional application No. 60/566,742, filed on Apr. 30, 2004.

(51) Int. Cl.
*H01S 3/08* (2006.01)

(52) U.S. Cl. ............. 372/99; 372/43.01; 372/46.012; 372/50.124; 372/96; 372/98; 257/98; 257/E33.069; 257/E33.072; 257/E51.021

(58) Field of Classification Search .......... 372/96, 372/43.01, 46.012, 50.124, 98, 99; 257/98, 257/E33.069, E33.072, E51.021
See application file for complete search history.

(56) References Cited

U.S. PATENT DOCUMENTS

| 4,943,970 | A | * | 7/1990 | Bradley | 372/45.01 |
|---|---|---|---|---|---|
| 5,363,393 | A | * | 11/1994 | Uomi et al. | 372/45.01 |
| 5,365,540 | A | * | 11/1994 | Yamanaka | 372/92 |
| 5,422,901 | A | | 6/1995 | Lebby et al. | |
| 5,491,710 | A | * | 2/1996 | Lo | 372/45.011 |
| 5,818,862 | A | * | 10/1998 | Salet | 372/50.124 |
| 5,991,326 | A | | 11/1999 | Yuen et al. | |
| 6,046,065 | A | * | 4/2000 | Goldstein et al. | 438/46 |
| 6,339,496 | B1 | * | 1/2002 | Koley et al. | 359/344 |

(Continued)

FOREIGN PATENT DOCUMENTS

WO 98/07218 2/1998

(Continued)

OTHER PUBLICATIONS

A. Bhattacharyya et al "High reflectivity and crack-free AlGaN/AlN ultraviolet distributed Bragg reflectors" American Vacuum Society, J. Vac. Sci Technol. B 20(3), May/Jun. 2002.*

(Continued)

*Primary Examiner*—Minsun Harvey
*Assistant Examiner*—Yuanda Zhang
(74) *Attorney, Agent, or Firm*—Workman Nydegger

(57) ABSTRACT

A VCSEL includes a substrate having a partially removed portion; a metal-assisted DBR having a metal layer and a first mirror stack, wherein the metal layer is located at the partially removed portion of the substrate; an active region having a plurality of quantum wells over the metal-assisted DBR; and a second mirror stack over the active region, wherein a number of alternating layers of the first mirror stack is substantially smaller than a number typically required for a VCSEL without the integrated metal reflector. Such a metal-assisted DBR is especially useful for a long-wavelength VCSEL on a InP substrate or a red-color VCSEL on a GaAs substrate.

19 Claims, 3 Drawing Sheets

U.S. PATENT DOCUMENTS

| | | | |
|---|---|---|---|
| 6,534,331 B2 * | 3/2003 | Liao et al. | 438/46 |
| 6,549,553 B1 * | 4/2003 | Uenohara et al. | 372/46.01 |
| 6,697,413 B2 * | 2/2004 | Hwang et al. | 372/96 |
| 6,852,557 B1 * | 2/2005 | Shieh | 438/31 |
| 7,136,406 B2 * | 11/2006 | Ryou | 372/45.011 |
| 2004/0042518 A1 * | 3/2004 | Tatum et al. | 372/46 |
| 2005/0094695 A1 * | 5/2005 | Trezza et al. | 372/50 |
| 2006/0029112 A1 * | 2/2006 | Young et al. | 372/7 |

FOREIGN PATENT DOCUMENTS

| | | |
|---|---|---|
| WO | 02/17445 | 2/2002 |

OTHER PUBLICATIONS

Wipiejewski, et al., *Improved Performance of Vertical-Cavity Surface-Emitting Laser Diodes with Au-Plated Heat Spreading Layer*, Electronics Letters, vol. 31, No. 4, Feb. 16, 1995, pp. 279-280.

Kotaki, et al., *GaInAsP/InP Surface Emitting Laser with Two Active Layers*, Extended Abstracts of the 16$^{th}$ Conference on Solid State Devices and Materials, Kobe, 1984, pp. 133-136.

U.S. Appl. No. 11/026,397, filed Dec. 30, 2004, entitled "InAlAs Having Enhanced Oxidation Rate Grown Under Very Low V/III Ratio."

* cited by examiner

US 7,860,143 B2

METAL-ASSISTED DBRS FOR THERMAL MANAGEMENT IN VCSELS

CROSS-REFERENCE TO RELATED APPLICATIONS

This application claims the benefit of U.S. Provisional Application No. 60/566,742, filed Apr. 30, 2004 and entitled METAL-ASSISTED DBRs FOR THERMAL MANAGEMENT IN VCSELS, which is hereby incorporated by reference.

BACKGROUND OF THE INVENTION

1. Field of the Invention

This invention relates to vertical cavity surface emitting lasers (VCSELs). More specifically, it relates to distributed Bragg reflector (DBR) mirrors for VCSELs.

2. Discussion of the Related Art

Vertical cavity surface emitting lasers (VCSELs) represent a relatively new class of semiconductor lasers. While there are many VCSEL variations, a common characteristic is that VCSELs emit light perpendicular to a semiconductor wafer's surface. Advantageously, VCSELs can be formed from a wide range of material systems to produce specific characteristics.

VCSELs include semiconductor active regions, distributed Bragg reflector (DBR) mirrors, current confinement structures, substrates, and contacts. Because of their complicated structure, and because of their specific material requirements, VCSELs are usually grown using metal-organic chemical vapor deposition (MOCVD) or molecular beam epitaxy (MBE).

FIG. 1 illustrates a typical long-wavelength VCSEL 10. As shown, an n-doped InP substrate 12 has an n-type electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is an insulating region 40 that provides current confinement. The insulating region 40 is usually formed either by implanting protons or by forming an oxide layer. In any event, the insulating region 40 defines a conductive annular central opening 42 that forms an electrically conductive path through the insulating region 40. Over the insulating region is a tunnel junction 28. Over the tunnel junction 28 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof).

In operation, an external bias causes an electrical current 21 to flow from the electrical contact 26 toward the electrical contact 14. The tunnel junction over the insulating region 40 converts incoming electrons into holes. The converted holes are injected into the insulating region 40 and the conductive central opening 42, both of which confine the current 21 such that the current flows through the conductive central opening 42 and into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the conduction layer 9, the cap layer 8, an aperture 30 in electrical contact 26, and out of the surface of the vertical cavity surface emitting laser 10.

It should be understood that FIG. 1 illustrates a typical long-wavelength VCSEL, and that numerous variations are possible. For example, the dopings can be changed (say, by providing a p-type substrate), different material systems can be used, operational details can be tuned for maximum performance, and additional structures and features can be added.

While generally successful, the conventional VCSELs have problems with DBRs. Thus, it is beneficial to consider DBRs in more detail. A DBR in VCSELs is formed by depositing 30 to 50 alternating layers of different transparent materials. Each layer is one quarter of a wavelength thick and the index of refraction is different for the two materials. In general, there are three main requirements for DBR materials. First, the two materials stacked must have significantly different indices of refraction (high refractive index contrast) to achieve high reflectivity to reduce optical losses. Second, the materials must be compatible with the substrate used to grow the active region. Third, the materials should be thermally conductive as well to dissipate the heat built-up during the operation of VCSELs. One problem is the poor thermal impedance of DBR materials that degrades performance of the VCSELs. Long-wavelength VCSELs on an InP substrate and red-color VCSELs on a GaAs substrate especially suffer from this poor thermal impedance of DBR materials, since these VCSELs are currently employing a DBR material system that has a poor thermal conductivity.

BRIEF SUMMARY OF THE INVENTION

Accordingly, the present invention is directed to a new VCSEL structure that substantially obviates one or more of the problems due to limitations and disadvantages of the prior art.

A principle of the present invention is to provide a VCSEL with a metal-assisted DBR. Due to a high reflectivity obtained through the metal-assisted DBR, the VCSEL according to the principles of the present invention has a reduced number of DBR pairs, which prevents the degradation of performance by dissipating the heat built-up in the VCSEL during the operation much faster, as compared with the conventional VCSELs. Such a VCSEL structure is particularly advantageous for long-wavelength VCSELs on an InP substrate as well as red-color VCSELs on a GaAs substrate.

In order to achieve these and other advantages and in accordance with the purpose of the present invention, as embodied and broadly described, a vertical cavity surface emitting laser may, for example, include a substrate having a partially removed portion; a metal-assisted DBR having a metal layer and a first mirror stack, wherein the metal layer is located at the partially removed portion of the substrate; an active region having a plurality of quantum wells over the metal-assisted DBR; and a second mirror stack over the active region.

In another aspect of the present invention, a VCSEL may, for example, include a first electrical contact formed of a metal layer; a first mirror stack over the first electrical contact; an active region having a plurality of quantum wells over the metal-assisted DBR; a second mirror stack over the active region; and a second electrical contact, wherein the first electrical contact and the first mirror stack form a metal-assisted DBR.

In yet another aspect of the present invention, a VCSEL may, for example, include a first electrical contact; a first mirror stack over the first electrical contact; an active region having a plurality of quantum wells over the metal-assisted DBR; a second mirror stack over the active region; and a second electrical contact formed of a metal layer, wherein the second electrical contact and the second mirror stack form a metal-assisted DBR.

In another aspect of the present invention, a VCSEL may, for example, include a first metal-assisted DBR having a first electrical contact and a first mirror stack; an active region having a plurality of quantum wells over the first metal-assisted DBR; and a second metal-assisted DBR having a second electrical contact and a second mirror stack over the active region, wherein a number of alternating layers of the first and second mirror stacks is in a range of about 3~30.

In still another aspect of the present invention, a vertical cavity surface emitting laser may, for example, include a first electrical contact; a first mirror stack over the first electrical contact; an active region having a plurality of quantum wells over the metal-assisted DBR; a second mirror stack over the active region; a metal layer formed over the second mirror stack, wherein the metal layer and the second mirror stack form a metal-assisted DBR; and a second electrical contact over the metal layer.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
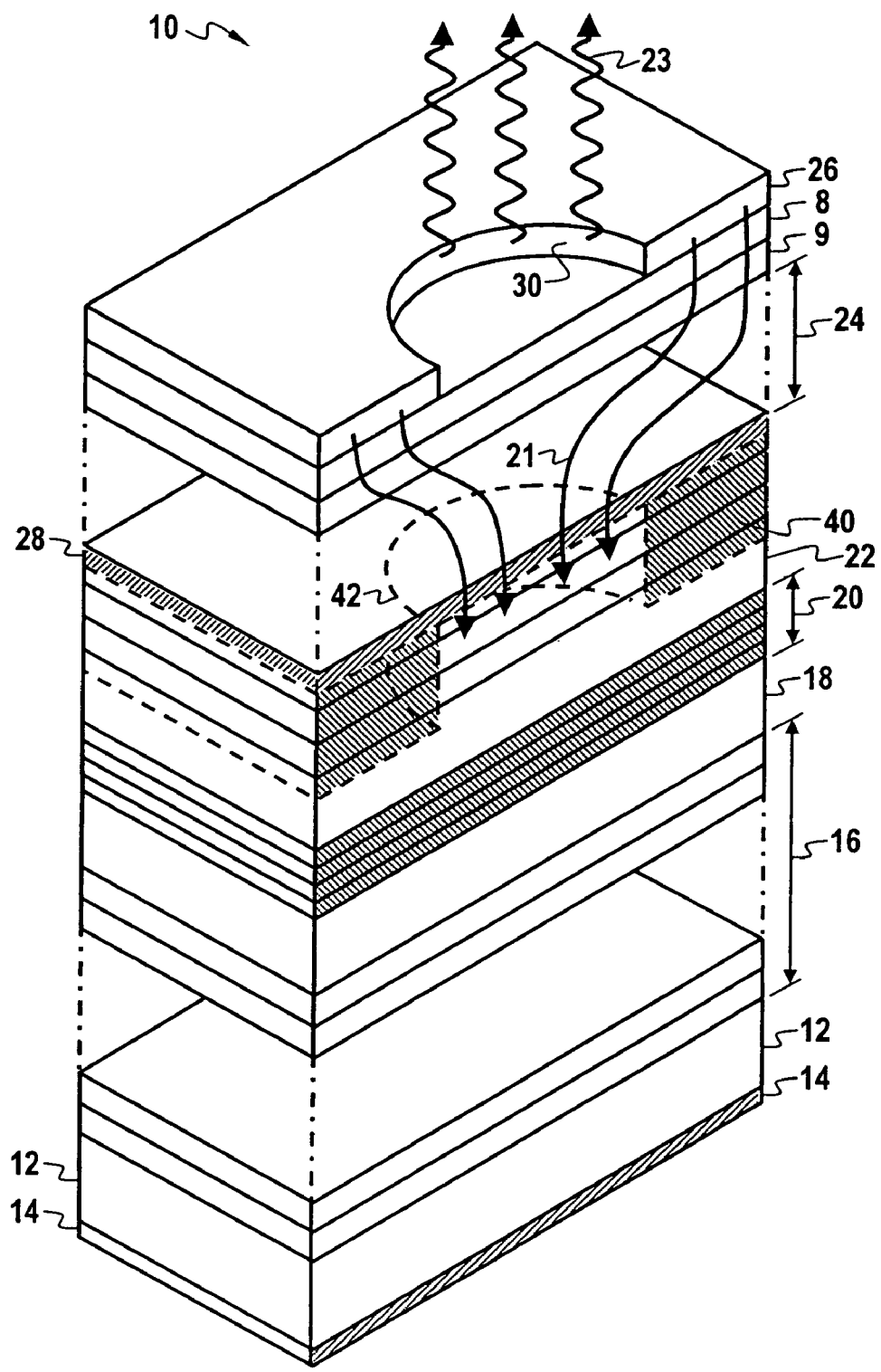
FIG. 1 illustrates a typical long-wavelength vertical cavity surface emitting laser (VCSEL)

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENT

Reference will now be made in detail to an embodiment of the present invention, examples of which are illustrated in the accompanying drawings. With reference to the drawings, the same reference numbers are used to indicate the same elements.

A principle of the present invention is to provide a VCSEL with a metal-assisted DBR. Due to a high reflectivity obtained through the metal-assisted DBR, the VCSEL according to the principles of the present invention has a reduced number of DBR pairs, which prevents the degradation of performance by dissipating the heat built-up in the VCSEL during the operation much faster, as compared with the conventional VCSELs. Such a VCSEL structure is particularly advantageous for long-wavelength VCSELs on an InP substrate as well as red-color VCSELs on a GaAs substrate.

A metal-assisted DBR that is in accord with the present invention includes a metal layer which serves as a heat-channel and a stable electrical contact. Although the metal-assisted DBR may be used for both top and bottom DBRs, it is beneficial to employ one metal-assisted DBR for VCSELs, replacing either the top DBR or bottom DBR.

Figure 2:
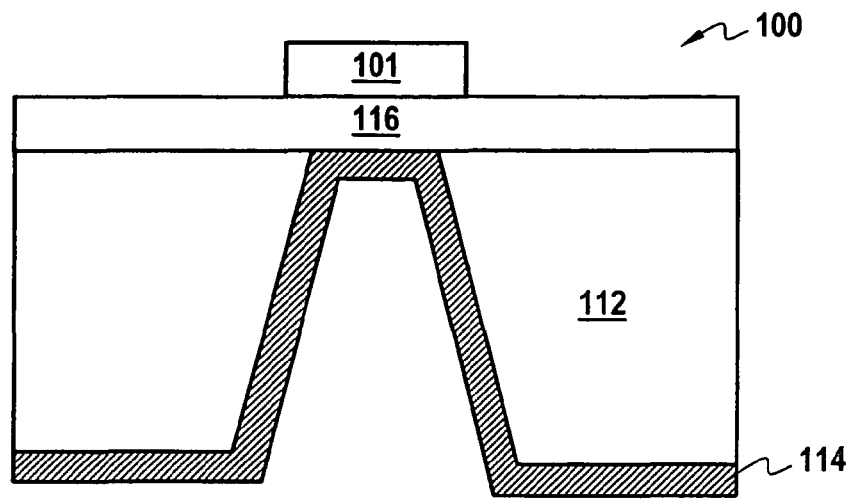
FIGS. 2 and 3 illustrate a long-wavelength VCSEL having a metal-assisted DBR according to a first embodiment of the present invention.
Figure 3:
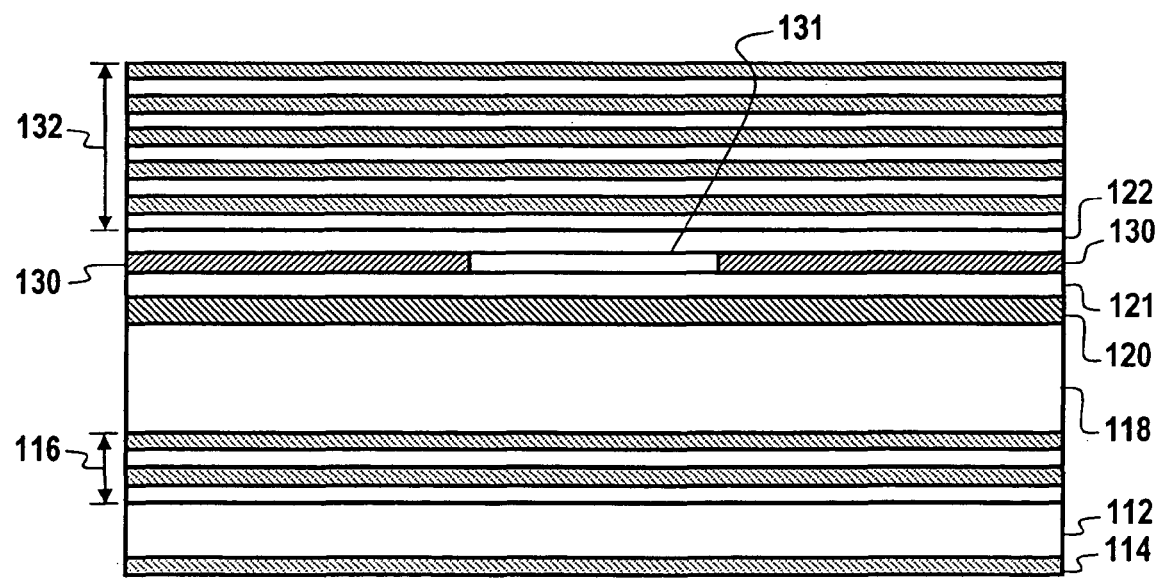

The principles of the present invention are now incorporated in an embodiment of a long-wavelength VCSEL having an indium phosphorus (InP) substrate. FIGS. 2 and 3 illustrates a first embodiment of the present invention. FIG. 2 shows a schematic side view of a long-wavelength VCSEL according to the first embodiment, and FIG. 3 is a simplified "cut-away" schematic depiction of the long-wavelength VCSEL in FIG. 2 for a better explanation of the present invention. In particular, FIG. 3 shows a detailed view of a upper part 101 of the long-wavelength VCSEL in FIG. 2, including a metal layer 114, substrate 112 and a lower mirror stack 116. However, it should be understood that the long-wavelength VCSEL in FIGS. 2 and 3 is generally configured as shown in FIG. 1.

As shown, a long-wavelength VCSEL 100 includes an n-doped InP substrate 112 having a metal layer 114, and the metal layer 114 is in contact with an n-doped lower mirror stack 116 (a DBR) and is located at a portion in which the InP substrate is partially removed. In this embodiment, the metal layer 114 serves as an n-type electrical contact and a heat-channel that dissipates the heat built-up during the operation of the VCSEL 100. Accordingly, the metal layer 114 and the lower mirror stack 116 forms a metal-assisted DBR in this embodiment. The metal layer 114 can be formed using the conventional deposition methods in the VCSEL technology, including beam deposition, thermal deposition, and sputtering, and can be made of any metal that has a good reflectivity and heat conductivity, such as gold, silver, or aluminum. Beneficially, the metal layer 114 should also have a good electrical contact with the lower mirror stack 116. The thickness of the metal layer 114 should be enough to serve as a heat channel.

Due to a high reflectivity of the metal layer 114, a number of the alternating layers of the lower mirror stack 116 can be reduced up to one-half of the number of the alternating layers of the conventional DBR, which results in a less heat built-up in the long-wavelength VCSEL 100 during the operation. Furthermore, since the metal layer 114 along with the partially removed substrate portion functions as a large heat-sink, the long-wavelength VCSEL 100 dissipates the heat built-up during the operation faster than the conventional VCSELs, thereby improving the performance.

Referring to FIGS. 2 and 3, the lower mirror stack 116 is beneficially grown on the InP substrate using, for example, an Metal Organic Chemical Vapor Deposition (MOCVD) process. However, it should be understood that these compound semiconductor layers in the present invention can also be grown using a Molecular Beam Epitaxy (MBE) method. Over the lower mirror stack 116 is an n-doped InP spacer 118 grown beneficially using MOCVD. An active region 120 having P-N junction structures with a number of quantum wells is formed over the lower spacer 118. The composition of the active region 120 is beneficially InAlGaAs, InGaAsP, or InP. The active region could be comprised of alternating material layers, depending on how the quantum wells are within the active region 120. Over the active region 120 is a p-type InP top spacer 121. Similar to the lower InP spacer 118, the p-type InP top spacer 121 is also grown using MOCVD. Over the p-type InP top spacer 121 is an insulating region 130 and a conductive annular central opening 131 that provide current confinement. Over the insulating region is a tunnel junction 122.

Still referring to FIGS. 2 and 3, over the tunnel junction 122 is an n-type top mirror stack 132 (another DBR). With the top mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) may be provided to complete the VCSEL 100.

Figure 4:
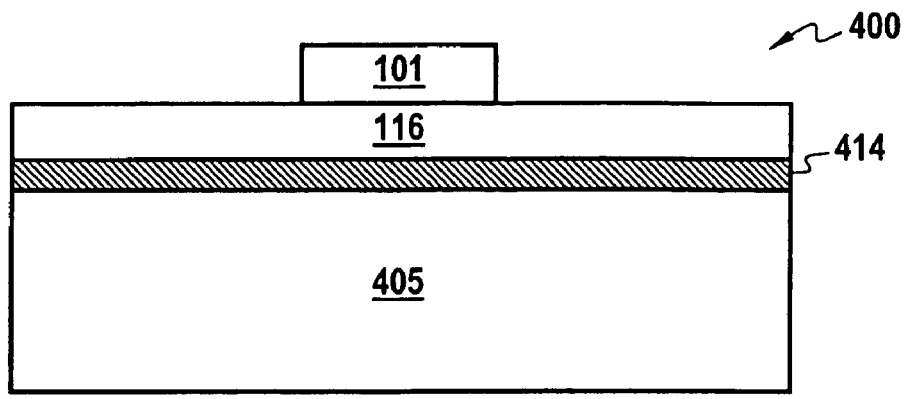
FIG. 4 illustrates a VCSEL having a metal-assisted DBR according to a second embodiment of the present invention.

FIG. 4 illustrates a second embodiment of the present invention. A long-wavelength VCSEL 400 includes a metal layer 414 on a carrier 405 that is in contact with a lower mirror stack 116 (a DBR). The VCSEL 400 is the same as the VCSEL 100 of the first embodiment except that the InP substrate 112 in FIG. 2 is completely removed and the carrier 405 supports the VCSEL structure. As in the case of the first embodiment, the metal layer 414 serves as an n-type electrical contact and a heat-channel that dissipates the heat built-up during the operation of the VCSEL 400. As a result, the metal layer 414 assists a high reflectivity of the lower mirror stack 116, thereby reducing the number of alternating layers of the lower mirror stack.

Figure 5:
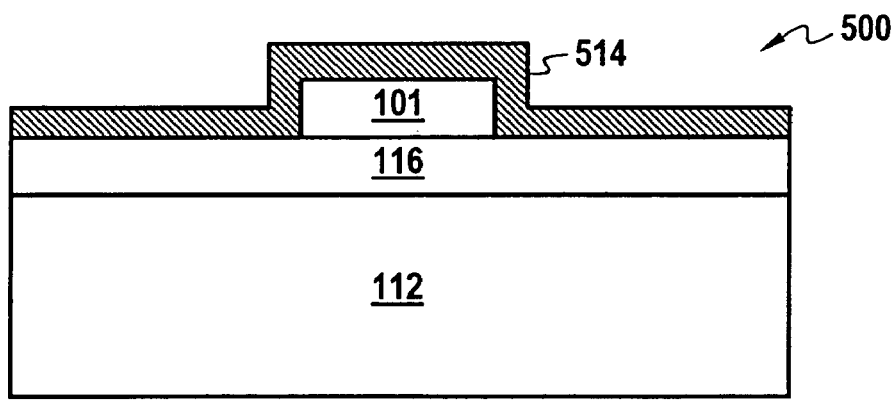
FIG. 5 illustrates a VCSEL having a metal-assisted DBR according to a third embodiment of the present invention.
Figure 6:
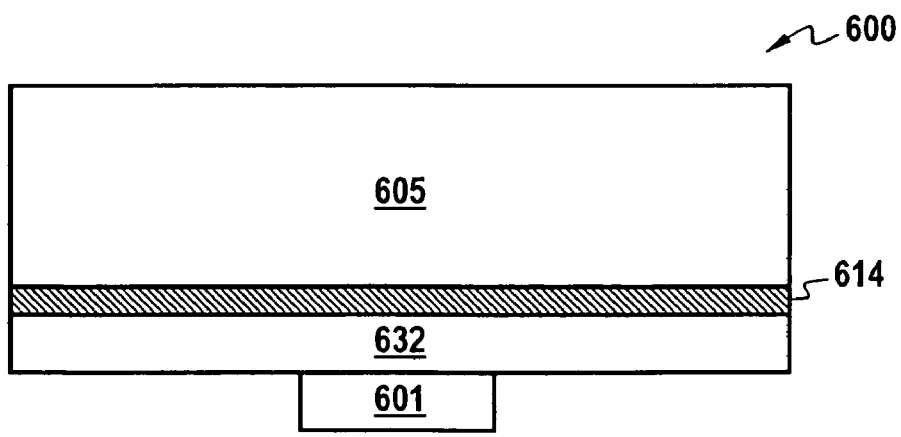
FIG. 6 illustrates a VCSEL having a metal-assisted DBR according to a fourth embodiment of the present invention.

A metal layer that is in accord with the principles of the present invention can also be used together with a top mirror stack (a DBR). At this time, the metal layer assists the high reflectivity of the top mirror stack, thereby reducing the number of the alternating layers of the top mirror stack. Accordingly, the combination of the metal layer and the top mirror stack forms a metal-assisted DBR in these embodiments. FIGS. 5 and 6 illustrate long-wavelength VCSELs in which a metal layer is used to assist a high reflectivity of top mirror stacks.

FIG. 5 illustrates a third embodiment of the present invention. A long-wavelength VCSEL 500 includes a metal layer 514 over a upper part 101 of the VCSEL 500, with the metal layer in contact with a top mirror stack (not shown, but similar to the top mirror stack 132 of FIG. 3). At this time, the metal layer 514 serves as a p-type electrical contact and a heat-channel that dissipates the heat built-up during the operation of the VCSEL 500. As a result, the metal layer 514 assists a high reflectivity of the top mirror stack, thereby reducing the number of alternating layers of the top mirror stack. Accordingly, the metal layer 514 and the top mirror stack forms a metal-assisted DBR in this embodiment. The metal layer 514 can be formed using the conventional deposition methods in the VCSEL technology, including beam deposition, thermal deposition, and sputtering, and can be made of any metal that has a good reflectivity and heat conductivity, such as gold, silver, or aluminum. Beneficially, the metal layer 514 should also have a good electrical contact with the top mirror stack. The thickness of the metal layer 514 should be enough to serve as a heat channel.

FIG. 6 illustrates a fourth embodiment of the present invention. A long-wavelength VCSEL 600 includes a metal layer 614 over a top mirror stack 632 (similar to the top mirror stack 132 of FIG. 3) and a lower part 601 of the VCSEL. As in the second embodiment, an InP substrate is completely removed, and a carrier 605 supports the VCSEL structure. The metal layer 614 serves as a p-type electrical contact and a heat-channel that dissipates the heat built-up during the operation of the VCSEL 600. As a result, the metal layer 614 assists a high reflectivity of the top mirror stack 632, thereby reducing the number of alternating layers of the top mirror stack 632. Accordingly, the metal layer 614 and the top mirror stack 632 forms a metal-assisted DBR in this embodiment.

A drawback of a VCSEL having a metal-assisted DBR is vulnerability of the DBR to metal migration, when current is allowed to flow through the interface between the DBR and the metal layer. This happens readily with high reflective metals, such as Ag and Au, and destroys the high reflection quality of the interface, rendering the implementation of the metal-assisted DBR ineffective. One method to circumvent this problem is to apply a thin layer of insulating material between the DBR and the metal layer, only where a high reflectivity is needed. Another method is to make such an insulating region requiring a high reflectivity by means of implants, which can also be done selectively. Accordingly, a metal-assisted DBR according to the principles of the present invention further includes such a partial insulation region between the DBR and the metal layer.

The long-wavelength VCSELs 100, 400, 500 and 600 constructed according to the principles of the present invention have significant advantages over prior art VCSELs. A smaller number of DBR layers is required to obtain the required high reflectivity, compared with the conventional VCSELs, which enables productive fabrication techniques, reduced cost, and better throughput and performance. In addition, the VCSEL 100 does not as much suffer from the degradation of performance caused by the heat built-up in the VCSELs during the operation as the conventional VCSELs.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface emitting laser, comprising:
  a substrate having a portion thereof removed to form a recessed region of the substrate;
  a metal-assisted DBR having a metal layer and a first mirror stack, no absorbing layer being interposed between the metal layer and first mirror stack, wherein the first mirror stack is positioned over the substrate, and wherein the metal layer is at least partially located in the recessed region of the substrate and is positioned below the first mirror stack so as to reflect light that passes through the first mirror stack;

an active region having a plurality of quantum wells over the metal-assisted DBR; and a second mirror stack over the active region.

2. A vertical cavity surface emitting laser according to claim 1, wherein the metal-assisted DBR further includes a partial insulating region between the metal layer and the first mirror stack.

3. A vertical cavity surface emitting laser according to claim 2, wherein the partial insulating region at a region of the metal-assisted DBR requires a high reflectivity.

4. A vertical cavity surface emitting laser according to claim 2, wherein the partial insulating region is formed either by depositing an oxide layer or by an implantation.

5. A vertical cavity surface emitting laser according to claim 1, wherein the substrate is either an InP substrate or a GaAs substrate.

6. A vertical cavity surface emitting laser according to claim 1, further including a current confinement structure over the active region, wherein the current confinement structure includes an insulating region, a conductive annular center and a tunnel junction over the current confinement structure.

7. A vertical cavity surface emitting laser according to claim 1, wherein the metal layer is formed of a combination of materials including a metal selected from the group consisting of gold, silver, and aluminum.

8. A vertical cavity surface emitting laser according to claim 1, wherein the recessed region of the substrate is in proximity of the active region.

9. A vertical cavity surface emitting laser according to claim 1, wherein the first and second mirror stacks are n-type DBRs.

10. A vertical cavity surface emitting laser according to claim 9, wherein the active region includes one of InGaAsP, AlInGaAs, and InP.

11. A vertical cavity surface emitting laser, comprising:
a first electrical contact formed of a metal layer;
a first mirror stack over the first electrical contact;
an active region having a plurality of quantum wells over a metal-assisted DBR;
a second mirror stack over the active region; and
a second electrical contact,
wherein the first electrical contact is positioned below the first mirror stack and in direct contact therewith so as to reflect light that passes through the first mirror stack, thereby providing the metal-assisted DBR,
wherein the metal-assisted DBR further includes a partial insulating region between at least a portion of the metal layer and the first mirror stack.

12. A vertical cavity surface emitting laser according to claim 11, wherein the partial insulating region is disposed at a region of the metal-assisted DBR requiring a high reflectivity.

13. A vertical cavity surface emitting laser according to claim 11, further including a current confinement structure over the active region.

14. A vertical cavity surface emitting laser according to claim 13, further including a tunnel junction over the current confinement structure.

15. A vertical cavity surface emitting laser according to claim 11, wherein the first and second mirror stacks are n-type DBRs.

16. A vertical cavity surface emitting laser according to claim 15, wherein the active region includes one of InGaAsP, AlInGaAs, and InP.

17. A vertical cavity surface emitting laser comprising:
a metal-assisted DBR that includes:
a top mirror stack; and
a metal layer in direct contact with the top mirror stack;
an active region positioned below the metal-assisted DBR; and
a bottom mirror stack positioned below the active region, at least a portion of the metal layer being in direct contact with a side of the bottom mirror stack that faces toward the active region.

18. A vertical cavity surface emitting laser according to claim 17, wherein the metal layer is positioned above the top mirror stack.

19. A vertical cavity surface emitting laser according to claim 1, wherein the first mirror stack is positioned over an uppermost surface of the substrate.

* * * * *